Sept. 6, 1955 V. J. LOUDEN 2,717,355

AMPLIFIER LIMIT CIRCUIT

Filed Aug. 18, 1952 2 Sheets-Sheet 1

Inventor:
Victor J. Louden,
by Richard E. Hosley
His Attorney.

Sept. 6, 1955 V. J. LOUDEN 2,717,355

AMPLIFIER LIMIT CIRCUIT

Filed Aug. 18, 1952 2 Sheets-Sheet 2

Inventor:
Victor J. Louden,
by Richard E. Hosley
His Attorney.

United States Patent Office 2,717,355

Patented Sept. 6, 1955

2,717,355

AMPLIFIER LIMIT CIRCUIT

Victor J. Louden, Schenectady, N. Y., assignor to General Electric Company, a corporation of New York Application August 18, 1952, Serial No. 304,892

22 Claims. (Cl. 323—64)

Figures 1, 2:
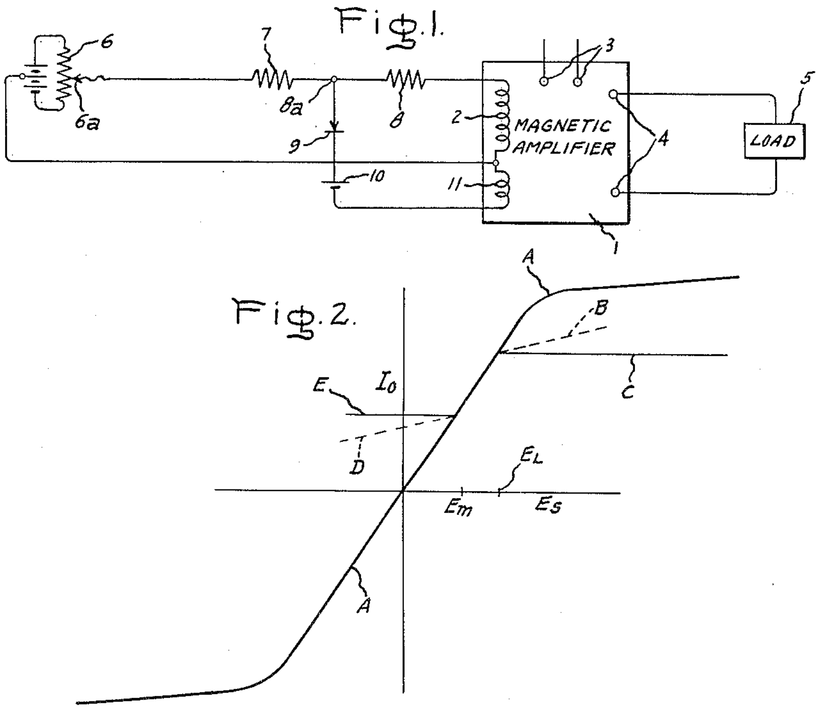

My invention relates to amplifier limit circuits, and more particularly to compensating means for such limit circuits to maintain the limited output substantially constant at a desired value independently of impedance in the limiting circuit. The invention is especially useful in conjunction with amplifiers, and particularly magnetic amplifiers, used in regulating systems requiring a rigid output limitation or take-over control responsive to some non-regulated condition of the controlled apparatus.

It is well known that biased unilaterally conducting shunt circuits may be utilized in many applications where it is desired to limit an output current or voltage to a predetermined value. Where such a limiting circuit is used to shunt an amplifier input circuit, such as the signal input winding of a magnetic amplifier, the finite impedance of the circuit, and particularly of the unilateral conducting device, prevents sharp limiting of the amplifier output. This is because, as the input signal voltage rises beyond the desired limiting value, the current through the limiting circuit increases so that the potential drop across the limiting circuit including the unilateral conducting device increases, thus increasing slightly the voltage available across the amplifier input winding in parallel with the limiting circuit. This effect decreases somewhat the effectiveness of the limiting circut in that the output varies with input voltage. Where a very rigid or stiff limit is required, this impedance effect in the limit circuit must be overcome.

In many applications, of course, amplifier output may be limited by saturation, so that a biased shunt limiting circuit is not required. However, in regulating systems utilizing signal amplifiers and provided with a limit control responsive to some condition of the controlled apparatus other than the regulated condition, it is not possible to rely upon saturation to limit the amplifier output, because the amplifier output must ordinarily be limited to zero to maintain the desired value of the limiting condition. In such systems a biased limiter is effective to initiate limiting action at a predetermined maximum or minimum value, and thereafter to limit amplifier output to zero. To provide a rigid limit for the non-regulated condition which is independent of opposing variation of the regulated condition, means must be provided to overcome the impedance effect of the limiting circuit.

It is, accordingly, a principal object of my invention to provide means for rigidly limiting the output of an amplifier to a predetermined value independently of the impedance of the limiting circuit.

More specifically, it is an object of my invention to provide, in a unilaterally conducting limiter for an amplifier circuit, means for compensating for the finite impedance of the limiting circuit including the unilateral conducting device, thereby to provide a stiff amplifier output limiting action.

It is a particular object of my invention to provide, in a regulating system provided with a signal amplifier having a biased unilaterally conducting limiter responsive to a non-regulated condition, means for improving the rigidity of the limiting action thereby to maintain a fixed predetermined value of the limiting condition independently of opposing variation of the regulation condition.

In carrying out my invention in one form I provide a magnetic amplifier, such as a push-pull type amplistat, having a direct current signal input winding connected to a source of control signal voltage. Across the input winding I connect a unilateral conducting device in series with a source of limiting bias voltage and a compensating winding magnetically coupled with the amplifier input winding. The bias voltage source is oriented normally to oppose signal voltages of a predetermined normal polarity, and the unilateral conducting device is oriented either to conduct current from the bias voltage source or from the signal voltage source, depending upon whether minimum or maximum limiting is desired. Current through the limiting circuit traverses the compensating winding, and this winding is disposed in aiding flux relation with the amplifier input winding for minimum amplitude limiting and in opposing flux relation with the amplifier input winding for maximum amplitude limiting. By utilizing impedance means to control the division of currents between the amplifier input winding and the limiting circuit including the compensating winding, the compensating winding may be so adjusted that its effect upon the input winding flux is just sufficient to compensate for the impedance of the limiting circuit. As used in a limited regulating apparatus of the type above referred to, the bias voltage is variable in accordance with some non-regulated limiting condition of the controlled apparatus.

Figure 3:
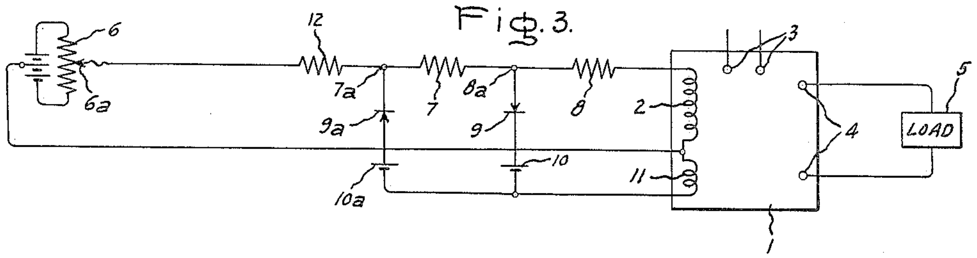
Figure 4:
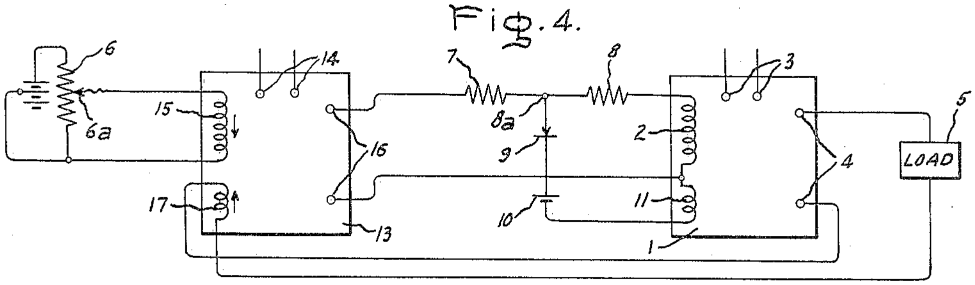
Figure 9:
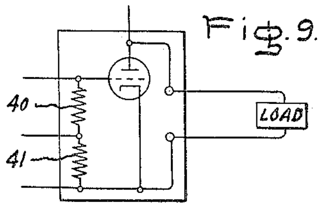
Figure 5:
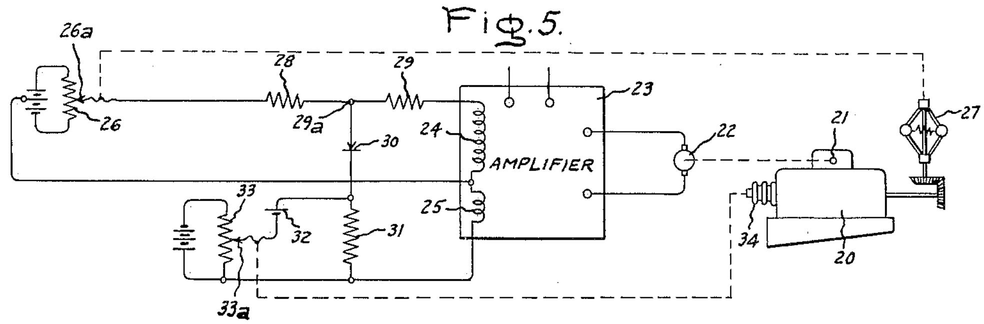
Figure 6:
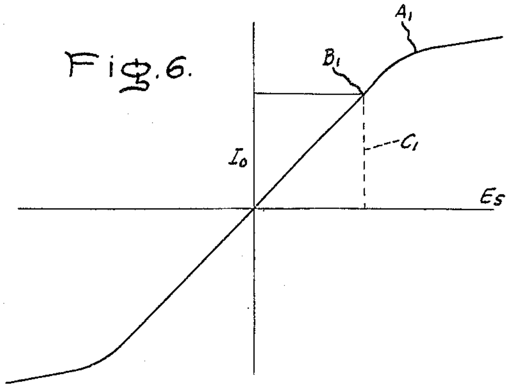
Figure 7:
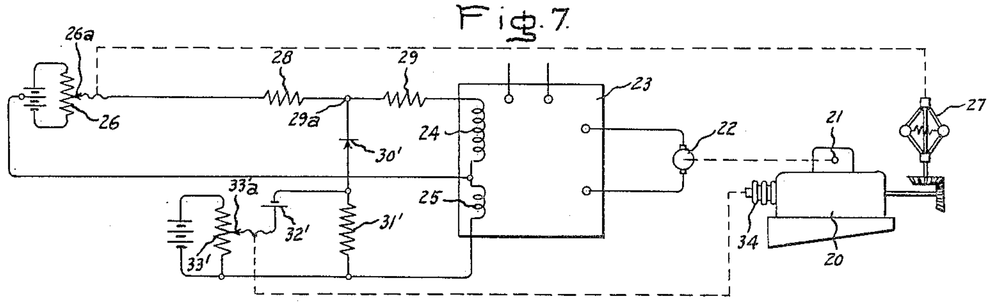
Figure 8:
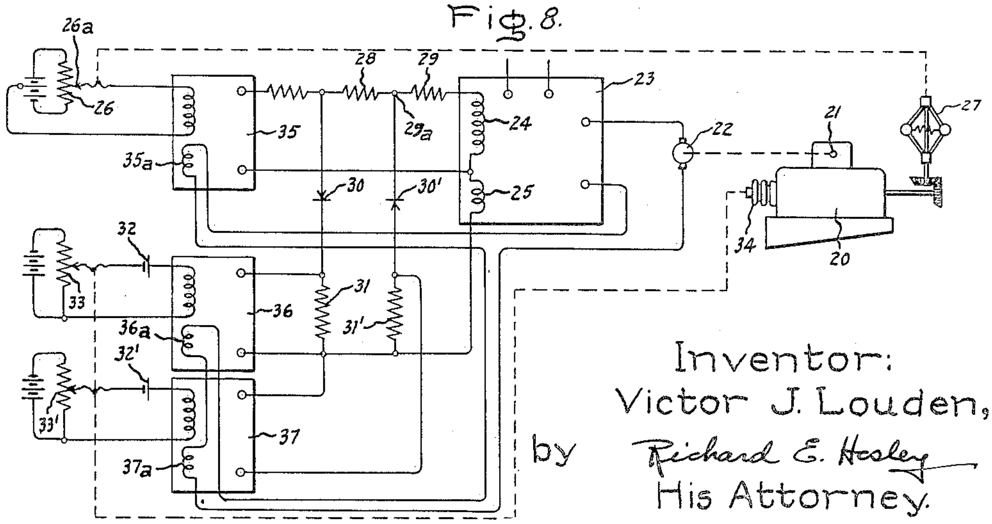

My invention itself will be more fully understood and its various objects and advantages further appreciated by referring now to the following detailed specification taken in conjunction with the accompanying drawing in which Fig. 1 is a schematic circuit diagram of a magnetic amplifier including a maximum output limiting circuit embodying my invention; Fig. 2 is a graphical representation of certain operating characteristics of the circuit shown at Fig. 1; Fig. 3 is a schematic circuit diagram of a magnetic amplifier including both maximum and minimum output limiting circuits embodying my invention; Fig. 4 is a schematic circuit diagram of a magnetic amplifier limiting circuit embodying my invention in still another form; Fig. 5 is a schematic circuit diagram of a limited regulating system embodying my invention; Fig. 6 is a graphical representation of certain operating characteristics of the system of Fig. 5; Figs. 7 and 8 are schematic circuit diagrams of regulating apparatus illustrating further applications of my invention; and Fig. 9 is a fragmentary circuit diagram illustrating application of my invention to an electronic amplifier.

Referring now to the drawing and particularly to Fig. 1, I have there illustrated in block form a magnetic amplifier 1 having a direct current input or control winding 2, a pair of alternating current supply terminals 3 and a pair of output terminals 4 connected to a suitable electric load device 5. Preferably the magnetic amplifier 1 is of the self-saturating amplistat type and comprises a pair of saturable devices connected in push-pull relation and demonstrating the typical gain characteristic illustrated at curve A of Fig. 2. At Fig. 2 the ordinate of the curve represents amplifier output current through the load device 5 and the abscissa represents signal input voltage at a signal source 6.

As illustrated at Fig. 1, a suitable source of unidirectional control signal voltage, shown as a potentiometer 6, is connected across the signal input winding 2 through a pair of resistors 7 and 8 in series circuit relation. The signal voltage from the source 6 is shown to be reversible in polarity, but with respect to the limiting action to be described its normal polarity is positive on the potentiometer slider *6a*.

From a point *8a* between the resistors 7 and 8, there is connected across the magnetic amplifier input winding 2 a signal amplitude limiting circuit including in series circuit relation a unilateral conducting device 9, a source of bias voltage 10 and a compensating winding 11 disposed on the magnetic amplifier 1 in magnetically coupled relation with the input winding 2. The unilateral conducting device 9 may be a diode electric discharge device or any suitable metallic semi-conducting device or rectifier. The bias voltage source 10 may be any suitable source of unidirectional biasing potential, either fixed, adjustable or variable in accordance with some program or condition, but has been illustrated at Fig. 1 as a battery of fixed voltage. The bias voltage source 10 is disposed in the limiting circuit to oppose signal voltages of the predetermined normal positive polarity at point *8a*.

If it is now assumed that at a signal voltage of value $E_1$ (Fig. 2) in the amplifier input winding 2 the positive potential at the point 8*a* between resistors 7 and 8 is equal to the bias potential of the source 10, it will be evident that for all signal voltages below this value no current flows through the rectifier 9 and the compensating winding 11, so that the output characteristic of the magnetic amplifier follows the curve A of Fig. 2. When the potential at the point 8*a* in the signal circuit rises slightly above the opposing potential of the bias source 10, current begins to flow through the limiting circuit in the direction determined by the rectifier 9, and such current in traversing the compensating winding 11 sets up a flux which is in opposition to the flux established by the amplifier input winding 2 for signal potentials of this predetermined normal polarity.

It may now be observed that, without considering the effect of the compensating winding 11 for the moment, conduction through the limiting circuit including the rectifier 9 shunts current away from the amplifier input winding 2 and limits the potential at the point *8a* to the potential of the biasing source 10 plus the potential drop across the limiting circuit. This means that as the signal voltage continues to increase, the current through the input winding 2 does not correspondingly increase, but remains substantially constant except as modified by the potential rise of the point 8*a* resulting from increasing voltage drop across the limiting circuit. It will therefore be evident that the amplifier output characteristic for signal voltages above the limiting value $E_1$ follows a characteristic such as that illustrated at curve B shown in dotted lines at Fig. 2.

It is to compensate for the slight rise in potential at the point 8*a* that the compensating winding 11 carrying the current through the signal limiting circuit is disposed on the amplifier 1 in flux opposition to the input winding 2. By suitable proportioning of the resistors 7 and 8 and the winding 11, the winding 11 is made to provide sufficient ampere turns to compensate for that increase in ampere turns of the winding 2 above the limiting point which results from the increasing potential drop across the limiting circuit including rectifier 9. By thus compensating for the slight increase in ampere turns of the input winding above the limiting point, as represented by the positive slope of the curve B, the amplifier output current is made to take the shape of the curve C of Fig. 2 indicating sharp limiting of the output.

At Fig. 3 I have illustrated another embodiment of my invention similar in all respects to that illustrated at Fig. 1 but including in addition a second limiting circuit connected from a point *7a* at the opposite end of the signal circuit resistor 7. The second limiting circuit includes the compensating winding 11 connected across the signal input winding 2 in series circuit relation with a second source of bias potential 10*a* and a second rectifier

*9a*. The second source of bias potential 10*a* is also disposed to oppose signal potentials of the predetermined normal polarity, but the rectifier 9*a* is disposed oppositely with respect to the rectifier 9, so that it conducts current from the bias source 10*a* through the signal input winding 2 and the compensating winding 11 in series circuit relation. An additional resistor 12 is interposed in the signal input circuit between the signal source 6 and the point *7a*. The limiting circuit including the rectifier 9 and the signal source 10 constitute a maximum amplitude limiting circuit, and the limiting circuit including the rectifier *9a* and the bias source 10*a* constitute a minimum amplitude limiting circuit.

In operation, the amplifier circuit shown at Fig. 3 acts in a manner entirely similar to the circuit shown at Fig. 1, in limiting amplifier output current to a predetermined maximum value determined by the bias voltage source 10. In addition, the limiting circuit including the rectifier *9a* and the bias voltage source 10*a* operates to prevent amplifier output current through the load device 5 from falling below a predetermined minimum value. In this latter operation it will be noted that, so long as the signal voltage at the point 7*a* is greater than a predetermined positive value $E_m$ shown at Fig. 2 (this being the potential of the bias source 10*a*), the rectifier *9a* remains nonconductive. If the signal potential at the point *7a* should fall below the value $E_m$, the bias source 10*a*, being of greater potential, renders the rectifier *9a* conductive, and current from the source 10*a* flows through a loop circuit including the rectifier *9a*, the resistors 7 and 8, the amplifier input winding 2 and the compensating winding 11. This component of current in the input winding 2 is in aiding relation with the signal current in this winding from the source 6, and the limiting circuit current in the compensating winding 11 flows in the opposite direction to current in this winding through the maximum amplitude limiting circuit, so that the compensating winding 11 is in aiding flux relation with respect to the input winding 2 for minimum amplitude limiting operation.

It will now be observed that, even without the compensating winding 11, the minimum amplitude limiting circuit supplies to the input winding 2 a current component which boosts the output of the amplifier 1, so that below the signal voltage value $E_m$ the amplifier would have a gain characteristic shown at the curve D, Fig. 2. The curve D is drawn in disregard of the effect of the compensating winding 11, and it will be noted that the amplifier output falls off somewhat as signal voltage decreases below the minimum limiting value because of the increasing amount of voltage drop consumed in the minimum limiting circuit as the limiting circuit current component increases in amplitude. This effect, however, is overcome by further boosting the output of the amplifier through the compensating winding 11, thus raising the amplifier characteristic below the minimum limiting value of signal voltage to a characteristic shown at curve E, Fig. 2. It will of course be understood by those skilled in the art that this adjustment is made by so proportioning the resistors 7, 8 and 12 and the ampere turns of the compensating winding 11, that this winding 11 compensates the amplifier input circuit for the effect of the impedance of the minimum limiting circuit including the rectifier *9a*, in a manner similar to the compensating effect previously described in connection with Fig. 1.

At Fig. 4 I have shown a further modification of my invention generally similar to the maximum amplitude limiting circuit shown at Fig. 1 and in which like parts have been assigned the same reference numerals. At Fig. 4 the signal voltage from the signal voltage source 6 is supplied to the magnetic amplifier input winding 2 through a second magnetic amplifier 13 having alternating current supply terminals 14, a direct current input winding 15 and output terminals 16. The output terminals 16 are connected across the amplifier input winding 2 in series circuit relation with the resistors 7 and 8. In addition I provide upon the signal amplifier 13 a control winding 17 energized in series circuit relation with the load device 5 and disposed in opposing flux relation with the input winding 15 of the amplifier 13. The control winding 17 thus provides for the amplifier 13 a degenerative feedback which results in reducing the gain through the input channel, thereby further tending to maintain the output of the amplifier 1 limited to a predetermined maximum value. It has been found that a degenerative feedback circuit such as shown at Fig. 4, when utilized in conjunction with the maximum amplitude limiting circuits of Figs. 1 and 4, greatly improves the output limiting characteristic of the amplifier 1.

My invention is also applicable to limiting circuits utilized in regulating apparatus to maintain maximum or minimum values of a variable condition of the controlled apparatus other than the regulated condition. By way of illustration I have shown at Fig. 5 a speed regulating apparatus for an internal combustion engine 20 having a fuel control valve 21 driven by a reversible direct current motor 22. The motor 22 is energized from the output of a magnetic amplifier 23 of the push-pull type having a direct current signal input winding 24 and a compensating winding 25. A control signal source, shown as a potentiometer 26, is connected to be controlled in accordance with the speed of the combustion engine 20 by means of a governor 27. The signal voltage from the source 26 is supplied to the amplifier input winding 24 through a pair of resistors 28 and 29 connected in series circuit relation, and the control signal may be either positive or negative in accordance with the direction of deviation of engine speed from a predetermined normal value. By way of illustration it will be assumed that, when the engine is running at the desired speed, the signal applied to the amplifier input winding 24 from the source 26 is zero, when the engine speed is less than normal a positive signal potential is applied by the potentiometer 26 to the potentiometer brush **26*a*, and when the engine speed is more than normal a negative signal potential is applied to the potentiometer brush 26*a***.

Across the amplifier input winding 24 from a point **29*a* between the resistors 28 and 29 there is connected a limiting circuit comprising in series circuit relation a unilateral conducting device or rectifier 30, a resistor 31 and a compensating winding 25. Across the resistor 31 there is connected a source of reference potential, shown as a battery 32, in series circuit relation with a source of variable limiting potential shown as a potentiometer 33, the voltage of which is controlled in accordance with some condition of the engine 20 other than the regulated speed. As illustrated, the limiting signal potential of the potentiometer 33 is variable in accordance with the engine temperature as indicated upon a thermostat 34. Normally the engine temperature is below a predetermined maximum value, so that the limit signal potential at the potentiometer brush 33*a* of the potentiometer 33 is less than the reference potential of the battery 32. These potential sources are in opposing relation and are so disposed that under this condition current is circulated through the resistor 31 from the battery 32 in such a direction that that end of the resistor 31 adjacent the rectifier 30 is positive, as indicated on the drawing. No current can therefore flow through the limiting circuit unless the signal potential at the point 29*a* is greater than the net bias potential across the resistor 31. By proper adjustment this condition does not exist until the variable bias potential across the resistor 31** approaches zero.

In operation, it may now be assumed that the engine 20 of Fig. 5 is running slightly under speed, so that a positive control signal potential appears at the point **29*a* of the signal circuit. Such positive potential results in a positive input signal to the amplifier 23 and a positive output signal following the characteristic curve $A_1$ of Fig. 6. A positive output current from the amplifier 23 means that the motor 22 is being driven in a direction to increase the supply of fuel to the engine 20. As this supply of fuel increases the engine temperature increases. If now such temperature approaches the limiting value determined by the potential of the battery 32, conduction through the limiting circuit takes place at that point on the output characteristic curve $A_1$ where the control signal potential at the point 29*a* is slightly greater than bias potential determined by the difference between the reference potential of the battery 32 and the limiting signal potential of the potentiometer brush 33*a***. It may be assumed that this occurs at a point $B_1$ on the curve $A_1$ of Fig. 6.

Such conduction through the limiting circuit would prevent any increase in positive potential of the point **29*a* except for the impedance of the limiting circuit including the rectifier 30. As previously explained, however, limiting current through the compensating winding 25 is in opposing relation to the current through the amplifier input winding 24** and is adjusted to compensate for the impedance effect of the limiting circuit.

It may now be observed, however, that while the limiting action thus far described prevents any further increase in the energization of the amplifier input winding 24, the still positive output of the amplifier continues to drive the fuel motor 22 in a direction to increase the fuel supply. If it is assumed for the purpose of simplicity that the engine speed, and thus the control signal from the source 26, remains constant, as due to increasing engine load, the engine temperature will still increase as a result of the increased fuel consumption, so that the potential at the potentiometer slider **33*a* controlled by temperature continues to approach the potential of the battery 32. This means that the bias potential drop across the resistor 31 in the limiting circuit continues to approach zero. Reduction of the impedance of the limiting circuit as the bias potential approaches zero increases the current flow through this circuit and causes reduction of the potential at the point 29*a*. At the point where the limiting signal potential of the potentiometer slider 33*a* equals the battery potential 32, the bias potential across the resistor 31 is zero and the limiting circuit operates in the manner of a complete short-circuit across the amplifier input winding 24, the impedance of the limiting circuit being compensated as explained by the compensating winding 25. It is thus evident that the result of conduction through the limiting circuit has been to reduce the amplifier output current along a line $C_1$ of Fig. 6 even though the control signal voltage from the source 26** remains substantially constant as assumed.

Reduction of the amplifier output to zero causes stoppage of the fuel motor 22, and discontinues further increase in the fuel supply. If this is not sufficient to reduce the engine temperature to the predetermined limiting value, the potential of the potentiometer brush **33*a* increases beyond the potential of the battery 32, thereby reversing the normal polarity of the bias potential across the resistor 31, so that a current greater than the necessary compensating current flows through the compensating winding 25 in a direction to produce a negative output current at the amplifier 23. Reversal of the amplifier output results in a decrease in the fuel supply, and equilibrium is reach at whatever final position of the fuel valve is necessary to maintain the temperature controlled limit signal potential of the potentiometer slider 33*a* equal to the potential of the reference battery 32**.

At Fig. 7 I have shown a regulating apparatus similar to that shown at Fig. 5, wherein like parts have been assigned the same or similar reference numerals but the limiting circuit is arranged to maintain a minimum rather than a maximum engine temperature. At Fig. 7 the rectifier 30′ is reversed in the limiting circuit with respect to the rectifier 30 shown at Fig. 5, and the normal polarity of the net biasing potential across the resistor 31′ is reversed from the normal polarity across the corresponding resistor 30 at Fig. 5. Similarly, the polarity of the battery 32' is reversed and that of the temperature controlled limit signal potential of the potentiometer brush 33a is reversed. In the embodiment of the invention illustrated at Fig. 7 the polarity of the potentiometer brush 33a' is normally greater than the potential of the reference battery 32', so that that end of the resistor 31' adjacent the rectifier 30' is normally negative.

It will now be evident that in the embodiment of the invention shown at Fig. 7, the potential of the potentiometer slider 33a' decreases to approach the potential of the battery 32' as the engine temperature decreases. As the potential of the slider 33a' decreases, a point is reached where the difference between this potential and that of the battery 32', which differences appears as the bias potential across the resistor 31', becomes slightly greater than the control signal potential at the point 29a. Whenever this condition occurs, whether the control signal potential be positive or negative, conduction takes place through the limiting circuit including the compensating winding 25. It will be assumed for the purpose of illustration that breakdown of the limiting circuit occurred at a time when the potential at the point 29a was negative, indicating fuel decreasing movement of the fuel motor 22. Current through the limiting circuit now prevents further decrease of the already negative potential at the point 29a, and in this action current through the compensating winding input 25 opposes the now negative energization of the amplifier winding 24 to an extent sufficient to compensate for the impedance of the limiting circuit.

So long as the potential of the point 29a remains negative, however, the fuel motor 22 continues to run in a direction to decrease the fuel supply. If it is assumed for the purpose of simplicity that no change in engine speed occurs, so that no change in the control signal potential at the potentiometer slider 26a occurs, the continued decrease in engine fuel will continue to decrease the engine temperature, so that by the operation of the potentiometer slider 33a' the net bias potential across the resistor 31' is progressively reduced to zero. At this point the limiting circuit appears as a complete short-circuit across the amplifier input winding 24, the impedance of the limiting circuit including the rectifier 30' being compensated by the winding 25 so that the amplifier output is zero and the fuel motor 22 is stopped. If this action is still not sufficient to maintain the engine temperature at the desired minimum, continued movement of the potentiometer slider 33a' results in a reversal of the normal bias potential polarity across the resistor 31', so that the current through the limiting circuit including the winding 25 is increased to a valve greater than that necessary for compensation. As a result, the output of the amplifier 23 is reversed and the fuel motor 22 is run in a forward direction to increase the fuel supply. It will be evident that equilibrium is reached at a point where the position of a fuel valve is just sufficient to maintain the engine temperature at its desired minimum value, at which point the limiting potential of the potentiometer slider 33a' is equal to the reference potential of the battery 32' so that no bias voltage appears across the resistor 31' and the amplifier input winding 24 is, in effect, completely short-circuited. At this point the amplifier output is zero and the fuel motor 22 is stopped.

It will now be evident to those skilled in the art that the same regulating system may be provided with the maximum take-over limit illustrated at Fig. 5 and also with the minimum take-over limit illustrated at Fig. 7, and that where the signal potential proportional to the regulated condition is derived from a second magnetic amplifier, improved operation of the system may be obtained by utilizing degenerative feedback from the output of the amplifier 23 of Figs. 5 and 7. At Fig. 8 these features have been shown combined into a single regulating apparatus wherein parts corresponding to those illustrated at Figs. 5 and 7 have been assigned like reference numerals. In addition, a control signal amplifier 35 and a pair of maximum and minimum limit signal amplifiers 36 and 37, respectively, are shown provided with degenerative feedback control windings 35a, 36a and 37a, respectively, all connected in series circuit relation in the output circuit of the limited amplifier 23.

It will now be further evident to those skilled in the art that my limiting circuit providing amplifier input compensation is not limited in its application to an electromagnetic amplifier, but may, for example, be equally well applied to an electronic type amplifier. In such application, as illustrated in the fragmentary diagram of Fig. 9, the control signal voltage, as from the signal source 26 of Fig. 5, may be applied across a portion 40 of a grid-to-cathode resistor and the current through the limiting circuit may traverse another portion 41 of the same resistor in opposing potential relation.

It will be further evident that the particular regulating system I have chosen to show such preferred application of the invention is illustrative only, the invention being equally applicable to systems which regulate any suitable apparatus in accordance with a condition other than speed and limit in accordance with a non-regulated condition other than temperature.

Thus, while I have shown and described only certain preferred embodiments of my invention by way of illustration, many other modifications will occur to those skilled in the art, and I therefore wish to have it understood that I intend in the appended claims to cover all such modifications as fall within the true spirit and scope of my invention.

What I claim as new and desire to secure by Letters Patent of the United States is:

1. In a magnetic amplifier having a direct current signal input winding, an amplifier output limiting circuit including a unilateral conducting device and a source of bias voltage connected in series circuit relation across said input winding, and a compensating winding connected in series circuit relation in said limiting circuit and magnetically coupled with said input winding to control said amplifier.

2. In a magnetic amplifier having a direct current signal input winding, an amplifier output limiting circuit including a unilateral conducting device and a source of bias voltage connected in series circuit relation across said input winding, said bias voltage opposing signal voltages of a predetermined normal polarity applied to said input winding, and a compensating winding connected in series circuit relation in said input circuit and magnetically coupled with said input winding thereby to compensate for voltage variation across said input winding resulting from impedance in said limiting circuit.

3. In a magnetic amplifier having a direct current signal input winding, an amplier limiting circuit including a unilateral conducting device and a source of bias voltage connected in series circuit relation across said input winding, said bias voltage opposing signal voltages of a predetermined normal polarity applied to said input winding and said unilateral conducting device being disposed to block the flow of current from said bias voltage source, and a compensating winding connected in series circuit relation in said limiting circuit and magnetically coupled with said input winding, said compensating winding being connected to carry current in flux opposition to signal currents of normal polarity in said input winding.

4. In a magnetic amplifier having a direct current signal input winding, an amplifier output limiting circuit including a unilateral conducting device and a source of bias voltage connected in series circuit relation across said input winding, said bias voltage source opposing signal voltages of a predetermined normal polarity applied to said input winding and said unilateral conducting device being disposed to conduct current from said bias voltage source, and a compensating winding connected in series circuit relation in said limiting circuit and magnetically coupled with said input winding, said compensating winding being connected to carry current in aiding flux relation with signal currents of normal polarity in said input winding.

5. In a magnetic amplifier having a direct current signal input winding, an amplifier output limiting circuit including a unilateral conducting device and a source of bias voltage connected in series circuit relation across said input winding, said bias voltage opposing signal voltages of a predetermined normal polarity applied to said input winding, a compensating winding connected in series circuit relation in said limiting circuit and magnetically coupled with said input winding, and impedance means connected to control the division of current in said windings to compensate said input winding for voltage variations resulting from the impedance of said limiting circuit.

6. In a magnetic amplifier having a direct current signal input winding, an amplifier output limiting circuit including a rectifier and a source of fixed bias voltage connected in series circuit relation across said input winding, said bias voltage opposing signal voltages of a predetermined normal polarity applied to said input winding and said rectifier being disposed to conduct current in response to signal voltages having an amplitude greater than said bias voltage, a compensating winding connected in series circuit relation in said limiting circuit and magnetically coupled with said input winding, said compensating winding being disposed when energized to oppose said input winding, and impedance means connected to control the division of current between said windings and proportioned so that said compensating winding compensates said input winding for voltage variations thereacross resulting from the impedance of said limiting circuit.

7. In a magnetic amplifier having a direct current signal input winding, an amplifier output limiting circuit including a rectifier and a source of fixed bias voltage connected in series circuit relation across said input winding, said bias voltage opposing signal voltages of a predetermined normal polarity applied to said input winding and said rectifier being disposed to conduct current from said bias voltage source whenever the signal voltage amplitude is less than the predetermined minimum value, a compensating winding connected in series circuit relation in said limiting circuit and magnetically coupled with said input winding, said compensating winding being disposed when energized to aid said input winding, and impedance means connected to control the division of current between said windings and proportioned so that said compensating winding compensates said input winding for voltage variations thereacross resulting from the impedance of said limiting circuit.

8. In an amplifier having a direct current signal input circuit including an input impedance, an output circuit coupled to said amplifier, a second amplier connected to supply unidirectional signal voltages to said input circuit, an amplifier output limiting circuit including a unilateral conducting device and a source of bias voltage connected in series circuit relation across said input impedance, means utilizing current in said limiting circuit to compensate for the voltage variation across said input impedance resulting from impedance in said limiting circuit, and means degeneratively coupling said output circuit to control said second amplifier.

9. In a magnetic amplifier having a direct current signal input winding and an output circuit, a second magnetic amplifier connected to supply unidirectional signal voltages to said input winding, an amplifier output limiting circuit including a unilateral conducting device and a source of bias voltage connected in series circuit relation aross said input winding, said bias voltage opposing signal voltages of a predetermined normal polarity, a compensating winding connected in series circuit relation in said signal limiting circuit and magnetically coupled with said input winding, and means degeneratively coupling said output circuit to control said second magnetic amplifier.

10. In a regulating system for maintaining substantially constant a condition of a controlled apparatus, means for generating a control signal voltage proportional to deviation of said condition from a desired value, means for changing said condition, means including an amplifier connected to actuate said condition changing means in accordance with said control signal voltage to restore said condition to said desired value, said amplifier having an input circuit including an input impedance, means connecting said input impedance for energization in accordance with said control signal voltage, an amplifier output limiting circuit including a unilateral conducting device and a source of bias potential connected in series circuit relation across said input impedance, means responsive to a second condition of said controlled apparatus for controlling the amplitude of said bias voltage, and means utilizing current in said limiting circuit to compensate for voltage variation across said input impedance resulting from impedance in said limiting circuit.

11. In a regulating system for maintaining substantially constant a condition of a controlled apparatus, means for generating a control signal voltage proportional to deviation of said condition from a desired value, means for changing said condition, means including an amplifier connected to actuate said condition changing means in accordance with said control signal voltage to restore said condition to said desired value, said amplifier having an input circuit including an input impedance, means connecting said input impedance for energization in accordance with said control signal voltage, an amplifier output limiting circuit including a unilateral conducting device and a resistor connected in series circuit relation across said input impedance, means for generating a limiting signal voltage proportional in magnitude to the value of a second condition of said controlled apparatus related to the regulated condition, a fixed source of reference voltage, means connecting said limit signal voltage and said reference voltage in opposing relation across said resistor, and means utilizing current in said limiting circuit to compensate for voltage variation across said input impedance resulting from impedance in said limiting circuit.

12. In a regulating system for maintaining substantially constant a condition of a controlled apparatus, means for generating a control signal voltage proportional to the deviation of said condition from a desired value, means for changing said condition, means including an amplifier connected to actuate said condition changing means in accordance with said control signal voltage to restore said condition to said desired value, said amplifier having an input circuit including an input impedance, means connecting said input impedance for energization in accordance with said control signal voltage, an amplifier output limiting circuit including a unilateral conducting device and a resistor connected in series circuit relation across said input impedance, means for generating a limiting signal voltage proportional to a second condition of said controlled apparatus related to said first condition, a source of fixed reference voltage, means connecting said reference voltage and said limiting signal voltage in opposing relation across said resistor, a compensating impedance connected in series circuit relation in said limiting circuit and coupled in input controlling relation with said input impedance thereby to compensate the amplifier output for voltage variation across said input impedance resulting from impedance in said limiting circuit, and impedance means connected in series circuit relation in said input circuit for controlling the division of current between said input impedance and said limiting circuit thereby to determine the degree of such voltage compensation.

13. In a regulating system for maintaining substantially constant a condition of a controlled apparatus, means for generating a control signal voltage proportional to deviation of said condition from a desired value, means for changing said condition, means including a magnetic amplifier connected to actuate said condition changing means in accordance with said control signal voltage to restore said condition to said desired value, said amplifier having a direct current signal input winding, means including a second magnetic amplifier connecting said input winding for energization in accordance with control signal voltage, an amplifier output limiting circuit including a unilateral conducting device and a resistor connected in series circuit relation across said input winding, means for generating a limiting signal voltage proportional to a second condition of said controlled apparatus related to the regulated condition, a source of fixed reference voltage, means connecting said reference voltage and said limiting signal voltage in opposing relation across said resistor, a compensating winding connected in series circuit relation in said limiting circuit and magnetically coupled with said input winding, and impedance means connected in series circuit relation with said input winding to determine the division of current between said input winding said limiting circuit.

14. In a magnetic amplifier having an input winding adapted to be energized by a signal voltage, an impedance in series with said input winding, a compensating winding adapted to be energized in opposing relation to said input winding, control means responsive to the potential across said input winding and impedance exceeding a predetermined value for energizing said compensating winding, the energization of said compensating winding being proportional to the excess energization of said input winding over said predetermined value, whereby the output of said amplifier is rigidly limited to a pre-established maximum value.

15. In a magnetic amplifier having an input winding adapted to be energized by a signal voltage, an impedance in series with said input winding, a compensating winding adapted to be energized in aiding relation to said input winding, control means responsive to the potential across said input winding and impedance falling below a predetermined value for energizing said compensating winding, the energization of said compensating winding being proportional to the decreased energization of said input winding with respect to said predetermined value, whereby the output of said amplifier is rigidly limited to a pre-established minimum value.

16. In a magnetic amplifier having an input winding adapted to be energized by a signal voltage, an impedance in series with said input winding, a compensating winding adapted to be energized in opposing relation to said input winding, control means responsive to the potential across said input winding and impedance exceeding a predetermined value for energizing said compensating winding, the energization of said compensating winding being proportional to the excess energization of said input winding over said predetermined value, whereby the output of said amplifier is rigidly limited to a pre-established maximum value, and means associated with said control means for varying said predetermined value.

17. In a magnetic amplifier having an input winding adapted to be energized by a signal voltage, an impedance in series with said input winding, a compensating winding adapted to be energized in aiding relation to said input winding, control means responsive to the potential across said input winding and impedance falling below a predetermined value for energizing said compensating winding, the energization of said compensating winding being proportional to the decreased energization of said input winding with respect to said predetermined value, whereby the output of said amplifier is rigidly limited to a pre-established minimum value, and means associated with said control means for varying said predetermined value.

18. In a magnetic amplifier having an input winding adapted to be energized by a signal voltage, an impedance in series with said input winding, a compensating winding, control means responsive to the potential across said input winding and impedance exceeding a predetermined value for energizing said compensating winding in flux opposing relation to said input winding, the energization of said compensating winding being proportional to the excess energization of said input winding over said predetermined value, a second impedance in series with said first impedance and input winding, a second control means responsive to the potential across said combined first impedance, second impedance, and input winding falling below a second predetermined value for energizing said compensating winding in aiding relation to the input winding, the energization of said compensating winding by the second control means being proportional to the decreased energization of the input winding with respect to the second predetermined value, whereby the output of said amplifier is rigidly limited between preselected maximum and minimum values.

19. In a magnetic amplifier having an input winding adapted to be energized by a signal voltage, an impedance in series with said input winding, a compensating winding, control means responsive to the potential across said input winding and impedance exceeding a predetermined value for energizing said compensating winding in flux opposing relation to said input winding, the energization of said compensating winding being proportional to the excess energization of said input winding over said predetermined value, a second impedance in series with said first impedance and input winding, a second control means responsive to the potential across said combined first impedance, second impedance, and input winding falling below a second predetermined value for energizing said compensating winding in aiding relation to the input winding, the energization of said compensating winding by the second control means being proportional to the decreased energization of the input winding with respect to the second predetermined value, whereby the output of said amplifier is rigidly limited between preselected maximum and minimum values, means associated with said control means for varying the first predetermined value, and means associated with the second control means for varying the second predetermined value.

20. In a magnetic amplifier having an input winding adapted to be energized by a signal voltage, an impedance in series with said input winding, a compensating winding adapted to be energized in opposing relation to said input winding, control means responsive to the potential across said input winding and impedance exceeding a predetermined value for energizing said compensating windings, the energization of said compensating winding being proportional to the excess energization of said input winding over said predetermined value whereby the output of said amplifier is rigidly limited to a pre-established maximum value, a second amplifier connected in cascade with said first amplifier to supply the signal voltage to said input circuit, and means degeneratively connecting the output of said amplifier to control said second amplifier.

21. In a magnetic amplifier having an input winding adapted to be energized by a signal voltage, an impedance in series with said input winding, a compensating winding adapted to be energized in aiding relation to said input winding, control means responsive to the potential across said input winding and impedance falling below a predetermined value for energizing said compensating winding, the energization of said compensating winding being proportional to the decrease energization of said first winding with respect to said predetermined value whereby the output of said amplifier is rigidly limited to a pre-established minimum value, a second amplifier connected in cascade with said first amplifier to supply the signal voltage to said input winding, and means degeneratively connecting the output of said amplifier to control said second amplifier.

22. In a magnetic amplifier having an input winding adapted to be energized by a signal voltage, an impedance in series with said input winding, a compensating winding, control means responsive to the potential across said input winding and impedance for energizing said compensating winding as the potential across said input winding and impedance exceeds a predetermined value, the energization of said compensating winding being proportional to the excess energization of said first winding over said predetermined value, a second impedance in series with said input winding and impedance, second control means responsive to the potential across said combined input winding, impedance, and second impedance for energizing said compensating winding in aiding relation to said input winding as said potential falls below a second predetermined value, the energization of said second winding by said latter means being proportional to the decreased energization of said winding with respect to said second predetermined value, whereby the output of said amplifier is rigidly limited between preselected maximum and minimum values, means associated with said control means for varying said first predetermined value, means associated with said second control means for varying said second predetermined value, a second amplifier connected in cascade with said first amplifier to supply the signal voltage to said input winding, and means degeneratively connecting the output of said amplifier to control said second amplifier.

References Cited in the file of this patent

UNITED STATES PATENTS

| | | |
|---|---|---|
| 2,139,232 | Hysko | Dec. 6, 1938 |
| 2,144,995 | Pulvermacher | Jan. 24, 1939 |
| 2,509,742 | Mynall | May 30, 1950 |
| 2,548,049 | Olson | Apr. 10, 1951 |